United States Patent
Kitagawa et al.

(10) Patent No.: US 10,895,586 B2
(45) Date of Patent: Jan. 19, 2021

(54) SEMICONDUCTOR INSPECTION JIG

(71) Applicant: Mitsubishi Electric Corporation, Tokyo (JP)

(72) Inventors: Tetsuya Kitagawa, Nagasaki (JP); Masayuki Kubota, Nagasaki (JP); Motoyoshi Koyanagi, Nagasaki (JP); Tomohito Taniuchi, Nagasaki (JP); Daisuke Ikeda, Nagasaki (JP); Kazuhiro Sasano, Nagasaki (JP); Yuji Kobayashi, Nagasaki (JP)

(73) Assignee: Mitsubishi Electric Corporation, Tokyo (JP)

( * ) Notice: Subject to any disclaimer, the term of this patent is extended or adjusted under 35 U.S.C. 154(b) by 361 days.

(21) Appl. No.: 15/679,186

(22) Filed: Aug. 17, 2017

(65) Prior Publication Data

US 2018/0164344 A1 Jun. 14, 2018

(30) Foreign Application Priority Data

Dec. 12, 2016 (JP) .................................. 2016-240326

(51) Int. Cl.
*G01R 1/04* (2006.01)
(52) U.S. Cl.
CPC ........... *G01R 1/0466* (2013.01); *G01R 1/045* (2013.01)
(58) Field of Classification Search
CPC .............................. G01R 1/0466; G01R 1/045
USPC .................................................... 324/756.02
See application file for complete search history.

(56) References Cited

U.S. PATENT DOCUMENTS

| | | | | |
|---|---|---|---|---|
| 5,438,481 A | * | 8/1995 | Murphy | H01L 23/495 257/E23.031 |
| 5,444,388 A | * | 8/1995 | Ideta | G01R 1/04 29/825 |
| 5,557,212 A | * | 9/1996 | Isaac | G01R 1/04 324/750.16 |
| 5,574,383 A | * | 11/1996 | Saito et al. | G01R 1/04 324/755 |
| 5,936,418 A | * | 8/1999 | Ideta et al. | G01R 31/02 324/755 |
| 2003/0006797 A1 | * | 1/2003 | Schweiger | G01R 1/0466 324/756.02 |

FOREIGN PATENT DOCUMENTS

JP 01-184478 A 7/1989
JP H01184478 * 7/1989 ............. G01R 31/26
(Continued)

OTHER PUBLICATIONS

Espacenet Patent Translate JP2010014585A Continuity Inspection Method of Flame Lead (Year: 2010).*
(Continued)

*Primary Examiner* — Farhana A Hoque
*Assistant Examiner* — Courtney G McDonnough
(74) *Attorney, Agent, or Firm* — Studebaker & Brackett PC

(57) ABSTRACT

A semiconductor inspection jig includes: a base on which a semiconductor device is placed; and a substrate provided on the base and including a conductive pattern, wherein the conductive pattern intersects with a lead of the semiconductor device placed on the base from a direction other than a horizontal direction with respect to the lead, and is in contact with an intermediate part of the lead without being in contact with a leading end of the lead.

4 Claims, 5 Drawing Sheets

(56) References Cited

FOREIGN PATENT DOCUMENTS

| JP | 01-217269 A | | 8/1989 | |
|---|---|---|---|---|
| JP | 06-018613 A | | 1/1994 | |
| JP | 2003-519800 A | | 6/2003 | |
| JP | 2010-014585 A | | 1/2010 | |
| JP | 2010014585 A | * | 1/2010 | ............ G01R 31/02 |
| JP | 2014-153293 A | | 8/2014 | |

OTHER PUBLICATIONS

Espacenet Patent Translate JPH01184478A Socket for Photoconductor Measurement (Year: 1989).*
An Office Action mailed by the Japanese Patent Office dated Jan. 7, 2020, which corresponds to Japanese Patent Application No. 2016-240326 and is related to U.S. Appl. No. 15/679,186.

\* cited by examiner

SEMICONDUCTOR INSPECTION JIG

BACKGROUND OF THE INVENTION

Field

The present invention relates to a semiconductor inspection jig used for inspection of electrical characteristics of semiconductor devices.

Background

A semiconductor inspection jig having a structure in which a lead is sandwiched between electrodes in the vertical direction so as to improve contact properties of the electrodes has been proposed (e.g., see JP H01-217269 A). Another semiconductor inspection jig having a structure in which a mount part of a semiconductor device is tapered for positioning and a probe is used, instead of a pattern, and is brought into contact with an intermediate part of a lead of the semiconductor device has been proposed (e.g., see JP H06-18613 A). An inspection jig, for a leadless semiconductor device having a structure in which a holding member and an electrode for contact are integrated has been proposed (e.g., see JP 2014-153293 A). An inspection jig for a multi-pin frame lead product having a structure in which a lead of a semiconductor device and a pattern of the jig are electrically connected via an interposer having conductivity in the thickness direction has been proposed (e.g., see JP 2010-14585 A). A socket for measurement of an optical semiconductor having a structure in which a semiconductor device guide is suspended by a spring and an electrode probe of a jig is brought into contact with an intermediate part of a lead has been proposed (e.g., see JP H01-184478 A).

In the case of inspecting electrical characteristics of a high-frequency power amplifier that handles high electric power, a probe cannot be used in transmission lines for high-frequency signals in terms of power durability, but instead an inspection jig, having a structure in which a ceramic substrate having a metallic pattern formed thereon is soldered to a metallic block is used. The inspection is performed by bringing a lead of a semiconductor device into contact with the metallic pattern. Gold is used for the metallic pattern and the metallic pattern has a small thickness of 4 to 10 µm. Accordingly, the metallic pattern has low mechanical durability and is worn due to contact with the lead, so that the metallic pattern is deteriorated after long-time use. In particular, a flash occurs at a leading end of the lead of the semiconductor device. Further, in the case of setting the semiconductor device, it is necessary to perform positioning of the semiconductor device in the vertical direction with respect to the lead in a state where the lead and the pattern are brought into contact with each other. For this reason, a portion of the semiconductor device where the leading end of the lead and the pattern are brought into contact with each other is most likely to be worn. As the wear of the pattern progresses for long-time use, the pattern is finally disconnected, which makes it impossible to perform the inspection.

SUMMARY

The present invention has been made to solve the above-mentioned problems, and an object of the present invention is to provide a semiconductor inspection jig that enables a longer product life.

According to the present invention, a semiconductor inspection jig includes: a base on which a semiconductor device is placed; and a substrate provided on the base and including a conductive pattern, wherein the conductive pattern intersects with a lead of the semiconductor device placed on the base from a direction other than a horizontal direction with respect to the lead, and is in contact with an intermediate part of the lead without being in contact with a leading end of the lead.

In the present invention, since the leading ends of the leads are not brought into direct contact with the conductive patterns, respectively, the wear of the conductive patterns is alleviated, which makes it possible to increase the life of the inspection jig.

Other and further objects, features and advantages of the invention will appear more fully from the following description.

DESCRIPTION OF EMBODIMENTS

A semiconductor inspection jig according to the embodiments of the present invention will be described with reference to the drawings. The same components will be denoted by the same symbols, and the repeated description thereof may be omitted.

First Embodiment

Figure 1:
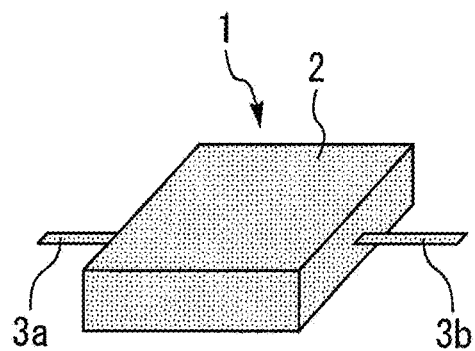
FIG. 1 is a perspective view illustrating a semiconductor device to be inspected.

FIG. 1 is a perspective view illustrating a semiconductor device to be inspected. A semiconductor device 1 is a high-frequency power amplifier that handles high electric power. The semiconductor device 1 includes a body part 2 having a semiconductor chip sealed therein, and leads 3a and 3b which project from the body part 2 in opposite directions. In the body part 2, the leads 3a and 3b are connected to the semiconductor chip. The semiconductor chip is sealed in the body part 2 by, for example, plastic molding. However, the method for sealing the semiconductor chip is not limited to this.

Figure 2:
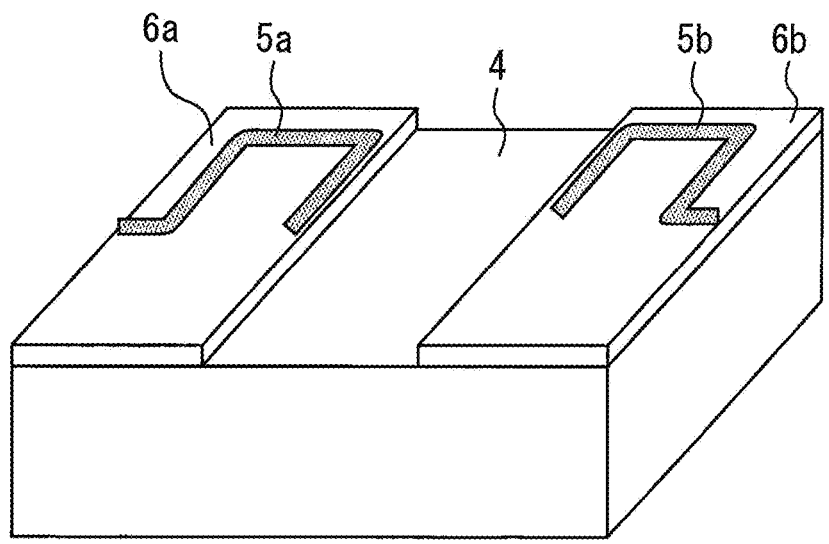
FIG. 2 is a perspective view illustrating a semiconductor inspection jig according to the first embodiment of the present invention.

FIG. 2 is a perspective view illustrating a semiconductor inspection jig according to the first embodiment of the present invention. A base 4 is a mount part on which the semiconductor device 1 is placed. Alumina substrates 6a and 6b including conductive patterns 5a and 5b, respectively, are formed on the base 4. The conductive patterns 5a and 5b are transmission lines for high-frequency signals that connect the semiconductor device 1 to an external component of the semiconductor inspection jig. A conductive pattern is also formed on the back surfaces of the alumina substrates 6a and 6b. This pattern is used for soldering of the base 4 and the alumina substrates 6a and 6b.

Figure 3:
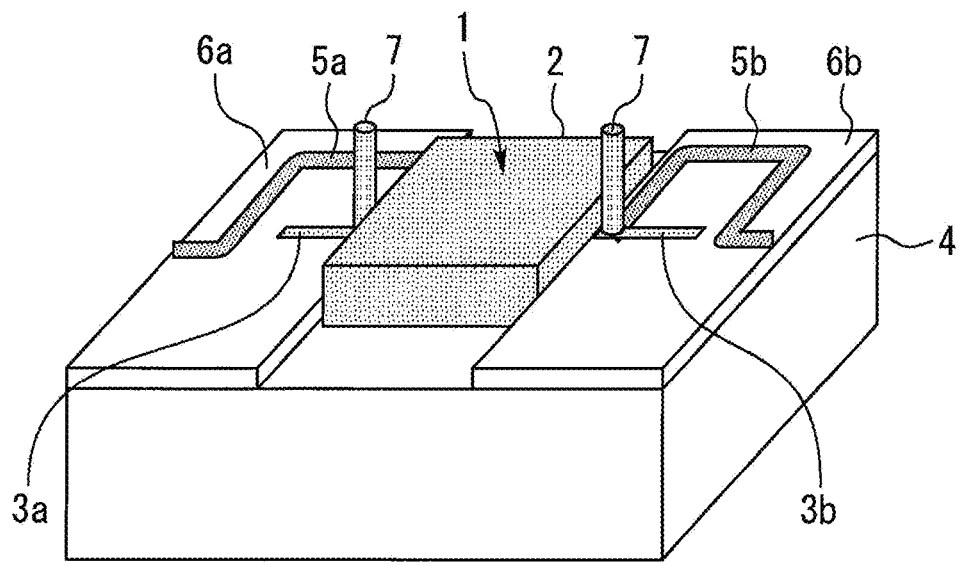
FIG. 3 is a perspective view illustrating a state where the inspection of the semiconductor device is performed using the semiconductor inspection jig according to the first embodiment of the present invention.

FIG. 3 is a perspective view illustrating a state where the inspection of the semiconductor device is performed using the semiconductor inspection jig according to the first embodiment of the present invention. The conductive patterns 5a and 5b intersect with the leads 3a and 3b, respectively, from a direction other than the horizontal direction with respect to the leads 3a and 3b of the semiconductor device 1 placed on the base 4 in a plan view as viewed along the vertical direction with respect to the top surface of the base 4, and are in direct contact with intermediate parts of the leads 3a and 3b, respectively, without being in direct contact with the leading ends of the leads 3a and 3b, respectively. In order to reliably establish the electrical connection between the leads 3a and 3b and the conductive patterns 5a and 5b, the leads 3a and 3b are pressed against the conductive patterns 5a and 5b, respectively, by applying a certain amount of load using a press bar 7 which is made of resin.

A high-frequency signal is input from the external component to the semiconductor device 1 via the conductive pattern 5a of the alumina substrate 6a. Further, an output signal from the semiconductor device 1 is output to the external component via the conductive pattern 5b of the alumina substrate 6b. Thus, the inspection of the semiconductor device 1 can be performed.

Figure 4:
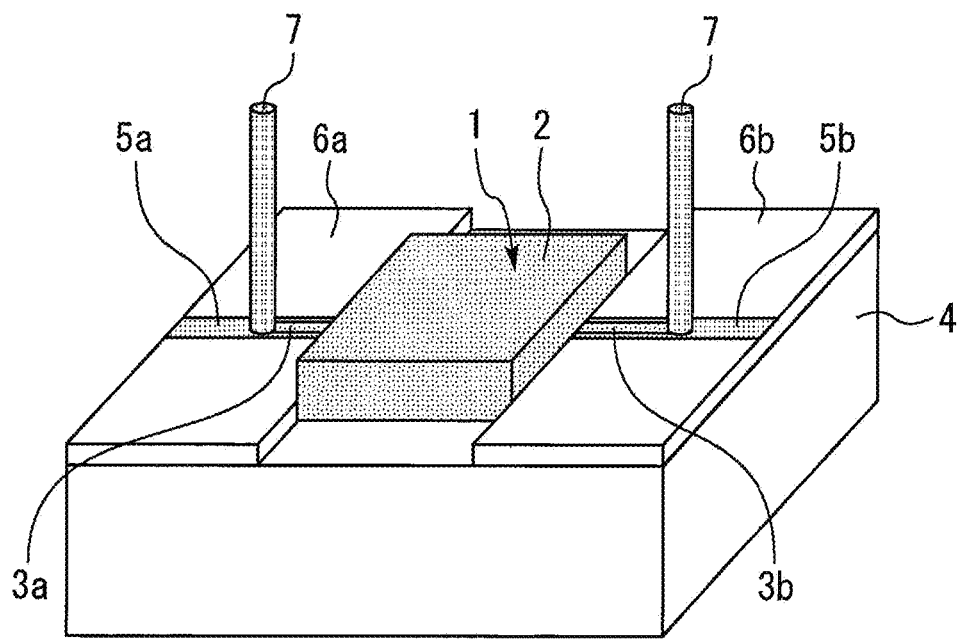
FIG. 4 is a perspective view illustrating a state where the inspection of the semiconductor device is performed using a semiconductor inspection jig according to a comparative example.

Next, advantageous effects of this embodiment will be described with reference to comparative examples. FIG. 4 is a perspective view illustrating a state where the inspection of the semiconductor device is performed using a semiconductor inspection jig according to a comparative example. The conductive patterns 5a and 5b are linear patterns extending in the horizontal direction with respect to the leads 3a and 3b of the semiconductor device 1. This causes a problem that the leading ends of the leads 3a and 3b are brought into direct contact with the conductive patterns 5a and 5b, respectively, so that the conductive patterns 5a and 5b are worn. On the other hand, in this embodiment, since the leading ends of the leads 3a and 3b are not brought into direct contact with the conductive patterns 5a and 5b, respectively, the wear of the conductive patterns 5a and 5b is alleviated, which makes it possible to increase the life of the inspection jig.

Second Embodiment

Figure 5:
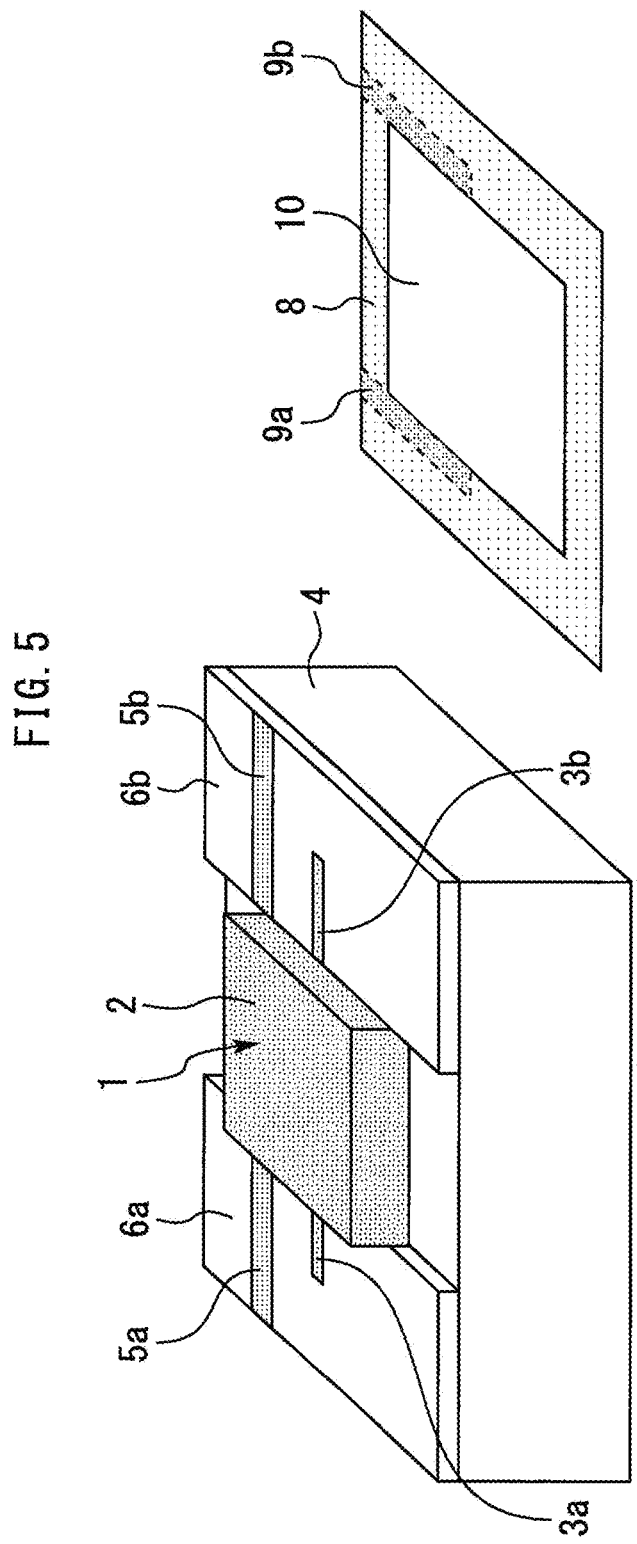
FIG. 5 is a perspective view illustrating a semiconductor inspection jig according to a second embodiment of the present invention.

FIG. 5 is a perspective view illustrating a semiconductor inspection jig according to a second embodiment of the present invention. The conductive patterns 5a and 5b on the alumina substrates 6a and 6b are not brought into direct contact with the leads 3a and 3b of the semiconductor device 1, which is placed on the base 4, and are spaced apart from each other. A contact sheet 8 is a resin film on which conductive patterns 9a and 9b are formed in the vertical direction with respect to the leads 3a and 3b. The contact sheet 8 is provided with a hole 10 which has a shape that matches the outer diameter size of the body part 2 of the semiconductor device 1.

Figure 6:
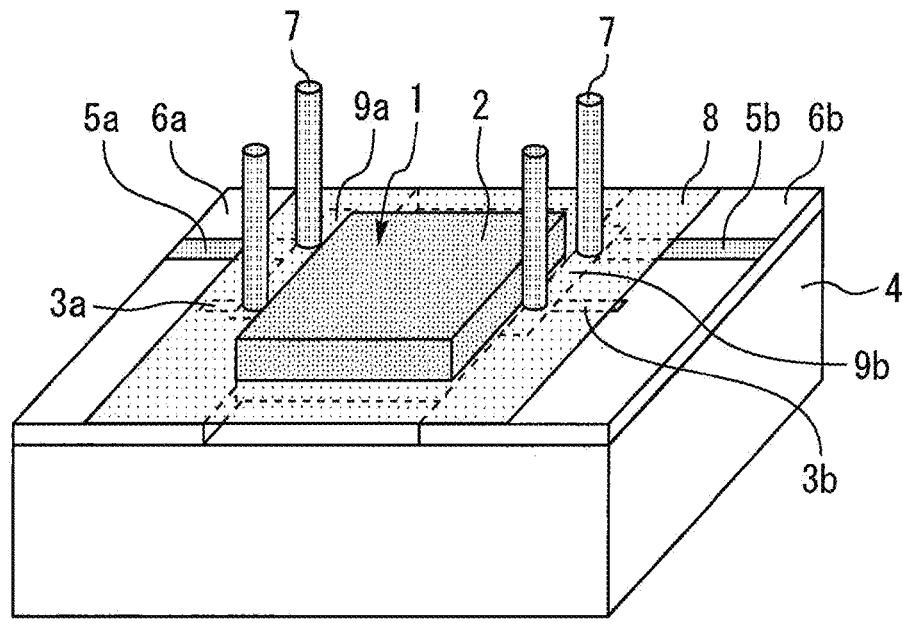
FIG. 6 is a perspective view illustrating a state where the inspection of the semiconductor device is performed using the semiconductor inspection jig according to the second embodiment of the present invention.

FIG. 6 is a perspective view illustrating a state where the inspection of the semiconductor device is performed using the semiconductor inspection jig according to the second embodiment of the present invention. The semiconductor device 1 is placed on the base 4 and the contact sheet 8 is positioned in such a manner that the body part 2 penetrates through the hole 10 in the contact sheet 8, and the leads 3a and 3b and the alumina substrates 6a and 6b are covered with the contact sheet 8. The conductive patterns 9a and 9b are brought into direct contact with intermediate parts of the leads 3a and 3b, respectively, without being in direct contact with the leading ends of the leads 3a and 3b, respectively, and the leads 3a and 3b and the conductive patterns 5a and 5b are connected via the conductive patterns 9a and 9b, respectively. In order to reliably establish the electrical connection, the conductive patterns 9a and 9b of the contact sheet 8 are pressed against the leads 3a and 3b and the conductive patterns 5a and 5b, respectively, by applying a certain amount of load using the press bar 7 which is made of resin.

Also in this embodiment, like in the first embodiment, since the leading ends of the leads 3a and 3b are not brought into direct contact with the conductive patterns 5a and 5b, respectively, the wear of the conductive patterns 5a and 5b is alleviated, which makes it possible to increase the life of the inspection jig.

Third Embodiment

Figure 7:
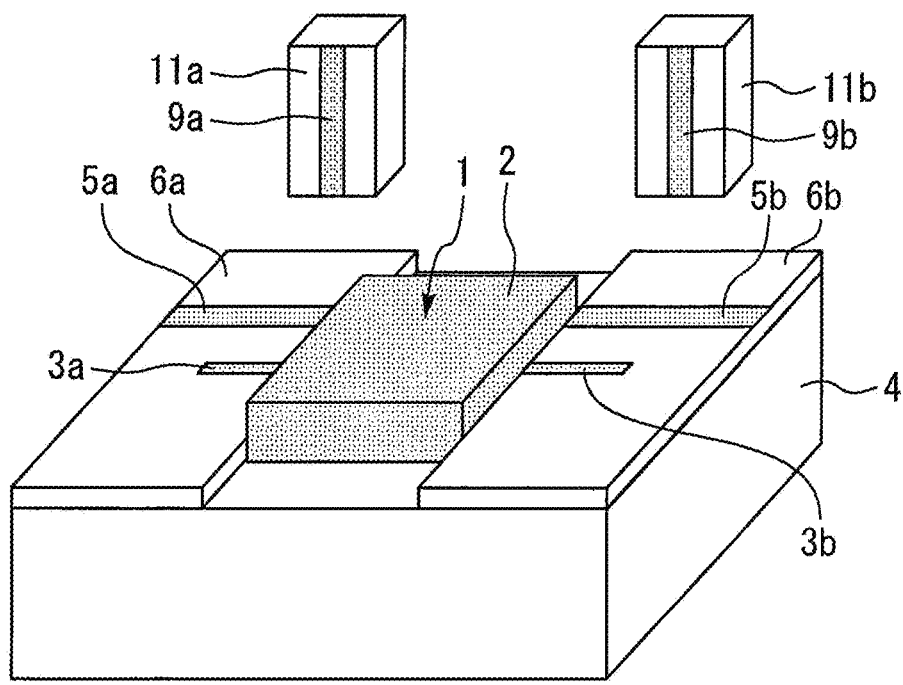
FIG. 7 is a perspective view illustrating a semiconductor inspection jig according to a third embodiment of the present invention.

FIG. 7 is a perspective view illustrating a semiconductor inspection jig according to a third embodiment of the present invention. In this embodiment, lead holding members 11a and 11b having the conductive patterns 9a and 9b formed thereon, respectively, in the vertical direction with respect to the leads 3a and 3b are used instead of the contact sheet 8 of the second embodiment. The other components of the third embodiment are similar to those of the second embodiment.

Figure 8:
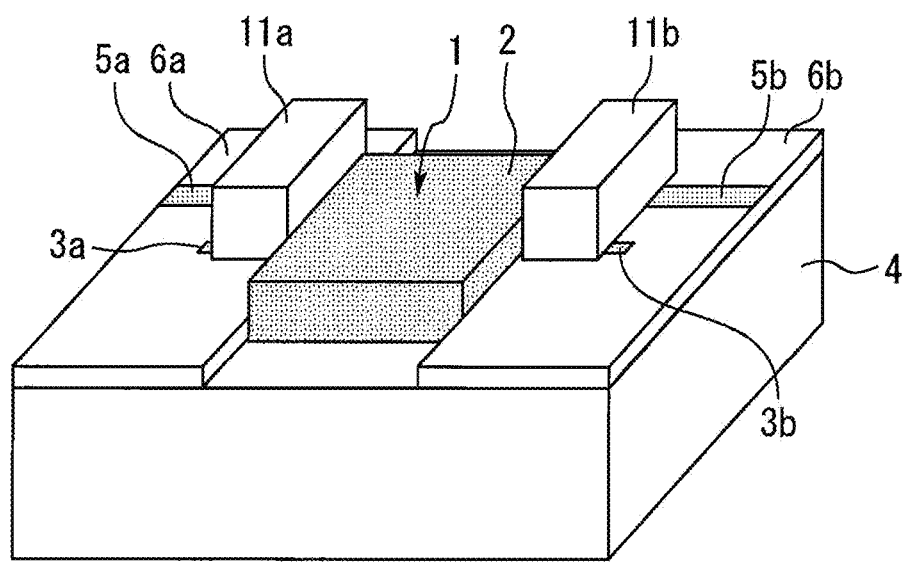
FIG. 8 is a perspective view illustrating a state where the inspection of the semiconductor device is performed using the semiconductor inspection jig according to the third embodiment of the present invention.

FIG. 8 is a perspective view illustrating a state where the inspection of the semiconductor device is performed using the semiconductor inspection jig according to the third embodiment of the present invention. The semiconductor device 1 is placed on the base 4 and the leads 3a and 3b are held by the lead holding members 11a and 11b, respectively. With this structure, the conductive patterns 9a and 9b are brought into direct contact with intermediate parts of the leads 3a and 3b, respectively, without being in direct contact with the leading ends of the leads 3a and 3b, respectively, and the leads 3a and 3b and the conductive patterns 5a and 5b are connected via the conductive patterns 9a and 9b, respectively.

Also in this embodiment, like in the first and second embodiments, since the leading ends of the leads 3a and 3b are not brought into direct contact with the conductive patterns 5a and 5b, respectively, the wear of the conductive patterns 5a and 5b is alleviated, which makes it possible to increase the life of the inspection jig.

Fourth Embodiment

Figure 9:
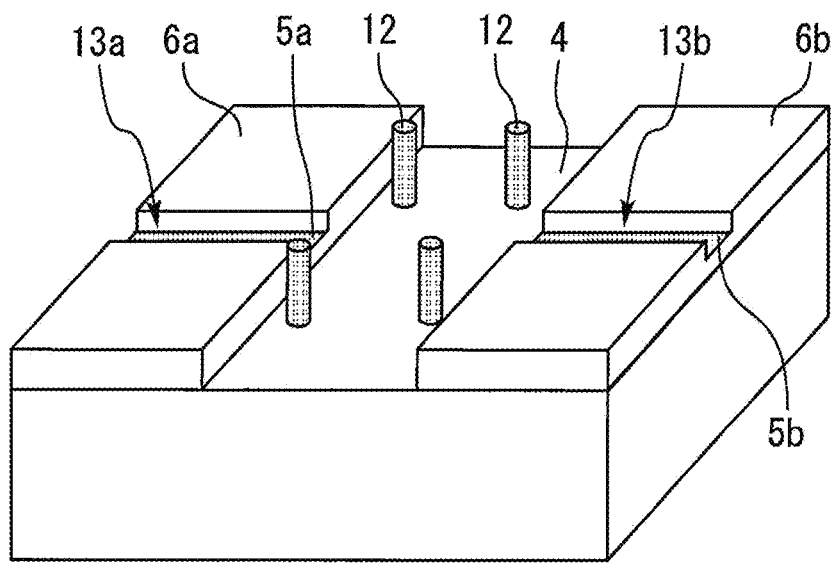
FIG. 9 is a perspective view illustrating a semiconductor inspection jig according to a fourth embodiment of the present invention.

FIG. 9 is a perspective view illustrating a semiconductor inspection jig according to a fourth embodiment of the present invention. A conductive spring-type probe 12 projects from the top surface of the base 4. The top surfaces of the alumina substrates 6a and 6b are provided with recesses 13a and 13b so as to match the widths of the leads 3a and 3b, respectively. The conductive patterns 5a and 5b are provided in the recesses 13a and 13b, respectively.

When the semiconductor device 1 is placed on the base 4, the semiconductor device 1 is lifted by the probe 12, so that the leads 3a and 3b are separated from the conductive patterns 5a and 5b, respectively. In this state, the semiconductor device 1 is moved in the vertical direction with respect to the leads 3a and 3b, thereby positioning the leads 3a and 3b and the conductive patterns 5a and 5b. After that, the semiconductor device 1 is pressed to shrink the probe 12, thereby bringing the leads 3a and 3b into direct contact with the conductive patterns 5a and 5b, respectively. The leads 3a and 3b are accommodated in the recesses 13a and 13b, thereby preventing the semiconductor device 1 from moving in the vertical direction with respect to the conductive patterns 5a and 5b.

In this embodiment, positioning of the semiconductor device 1 can be performed in a state where the leading ends of the leads 3a and 3b are not in direct contact with the conductive patterns 5a and 5b, respectively. Consequently, the wear of the conductive patterns 5a and 5b is alleviated, which makes it possible to increase the life of the inspection jig.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-240326, filed on Dec. 12, 2016 including specification, claims, drawings and summary, on which the Convention priority of the present application is based, is incorporated herein by reference in its entirety.

The invention claimed is:

1. A semiconductor inspection jig comprising:
a base on which a semiconductor device having a lead extending in a horizontal direction is placed;
a substrate provided on a surface of the base;
a first conductive pattern formed on a first surface of the substrate, the first surface of the substrate being a surface that faces the lead when the semiconductor device is placed on the base; and
a second conductive pattern formed on a second surface of the substrate, the second surface of the substrate being a surface opposite the first surface of the substrate, wherein
the first conductive pattern intersects with the lead of the semiconductor device placed on the base from a direction other than the horizontal direction with respect to the lead, and is in contact with an intermediate part of the lead without being in contact with a leading end of the lead,
the first conductive pattern contacts a first surface of the lead, the first surface of the lead being a surface that faces the substrate when the semiconductor device is placed on the base,
the second conductive pattern is for soldering of the substrate and the base, and
the leading end of the lead does not overlap any part of the first conductive pattern in a plan view as viewed along a normal direction with respect to the surface of the base.

2. A semiconductor inspection jig comprising:
a base on which a semiconductor device is placed;
a substrate provided on a surface of the base and including a first conductive pattern not being in contact with a lead of the semiconductor device placed on the base; and
a contact sheet including a second conductive pattern, wherein
when the semiconductor device is placed on the base and the lead and the substrate are covered with the contact sheet, the second conductive pattern is brought into contact with an intermediate part of the lead without being in contact with a leading end of the lead, wherein
the lead and the first conductive pattern are connected via the second conductive pattern, and
the leading end of the lead does not overlap any part of the second conductive pattern in a plan view as viewed along a normal direction with respect to the surface of the base.

3. The semiconductor inspection jig according to claim 2, wherein the contact sheet includes a hole having a shape that matches an outer diameter size of a body part of the semiconductor device, and
the contact sheet is positioned in such a manner that the body part penetrates through the hole in the contact sheet.

4. A semiconductor inspection jig comprising:
a base on which a semiconductor device is placed;
a substrate provided on a surface of the base and including a first conductive pattern not being in contact with a lead of the semiconductor device placed on the base; and
a lead holding member including a second conductive pattern, wherein
when the semiconductor device is placed on the base and the lead is held by the lead holding member, the second conductive pattern is brought into contact with an intermediate part of the lead without being in contact with a leading end of the lead, wherein
the lead and the first conductive pattern are connected via the second conductive pattern, and
the leading end of the lead does not overlap any part of the second conductive pattern in a plan view as viewed along a normal direction with respect to the surface of the base.

* * * * *